US010674620B2

(12) United States Patent
Chia et al.

(10) Patent No.: US 10,674,620 B2
(45) Date of Patent: Jun. 2, 2020

(54) REMOVABLE MODULE ADAPTER FOR MODULAR ELECTRONIC SYSTEM

(71) Applicant: CISCO TECHNOLOGY, INC., San Jose, CA (US)

(72) Inventors: Vic Hong Chia, Sunnyvale, CA (US); Edward John Kliewer, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/144,454

(22) Filed: Sep. 27, 2018

(65) Prior Publication Data
US 2020/0107461 A1 Apr. 2, 2020

(51) Int. Cl.
H05K 5/02 (2006.01)
H05K 5/00 (2006.01)
H04L 12/933 (2013.01)
H04L 12/935 (2013.01)
H05K 7/14 (2006.01)

(52) U.S. Cl.
CPC .......... H05K 5/0291 (2013.01); H04L 49/15 (2013.01); H04L 49/30 (2013.01); H05K 5/0065 (2013.01); H05K 5/0069 (2013.01); H05K 7/1489 (2013.01)

(58) Field of Classification Search
None
See application file for complete search history.

(56) References Cited

U.S. PATENT DOCUMENTS

| | | | | |
|---|---|---|---|---|
| 6,062,894 A * | 5/2000 | Barringer | ............. | H05K 7/1415 439/377 |
| 6,552,915 B2 * | 4/2003 | Takahashi | ............ | H05K 7/1418 361/752 |
| 6,611,424 B2 * | 8/2003 | Huang | ................. | G11B 33/128 248/224.51 |
| 6,935,868 B1 * | 8/2005 | Campini | ................. | G06F 1/186 361/748 |
| 7,027,309 B2 * | 4/2006 | Franz | ............... | H01R 13/62933 361/732 |
| 7,140,900 B1 * | 11/2006 | Villanueva | ........... | H05K 7/1431 439/327 |
| 7,167,380 B2 * | 1/2007 | Ice | ....................... | H05K 7/1404 361/727 |
| 7,257,886 B2 * | 8/2007 | Haager | ................ | H05K 7/1461 29/739 |
| 7,463,494 B2 * | 12/2008 | Downing | ............... | H05K 5/023 361/732 |
| 8,203,851 B2 * | 6/2012 | Boetzer | ................ | H05K 7/1409 361/801 |
| 8,369,092 B2 * | 2/2013 | Atkins | .................... | G06F 1/187 361/727 |

(Continued)

Primary Examiner — Xanthia C Cunningham
(74) Attorney, Agent, or Firm — Cindy Kaplan

(57) ABSTRACT

In one embodiment, an apparatus includes a module adapter comprising a first connector for connection to a modular electronic system and a second connector for connection to a module inserted into a chassis of the modular electronic system to couple the module with the modular electronic system. The module adapter is removably inserted into the chassis of the modular electronic system with an adapter tool operable to lock the module adapter in place in the chassis. A method for insertion of the module adapter is also disclosed herein.

20 Claims, 9 Drawing Sheets

(56) References Cited

U.S. PATENT DOCUMENTS

| | | | | |
|---|---|---|---|---|
| 8,482,925 B2* | 7/2013 | Yang | G06F 1/183 | 361/727 |
| 9,274,548 B2* | 3/2016 | Foisy | G06F 1/16 | |
| 9,313,909 B1 | 4/2016 | Huang | | |
| 9,894,795 B1 | 2/2018 | Twiss | | |
| 10,264,698 B2* | 4/2019 | Kho | H05K 7/1489 | |
| 2002/0135987 A1* | 9/2002 | Baldwin | H05K 7/142 | 361/730 |
| 2003/0080568 A1* | 5/2003 | Busby | A47B 81/06 | 292/197 |
| 2003/0123221 A1* | 7/2003 | Liao | G06F 1/184 | 361/679.31 |
| 2004/0066632 A1* | 4/2004 | Fang | G06F 1/184 | 361/727 |
| 2005/0174743 A1* | 8/2005 | Downing | H05K 5/023 | 361/725 |
| 2005/0207134 A1* | 9/2005 | Belady | H05K 1/14 | 361/796 |
| 2005/0243533 A1* | 11/2005 | Malone | H05K 7/1421 | 361/801 |
| 2005/0243534 A1* | 11/2005 | Robertson | G06F 1/184 | 361/801 |
| 2006/0018105 A1* | 1/2006 | Suzue | H05K 7/1409 | 361/798 |
| 2006/0134953 A1* | 6/2006 | Williams | H05K 7/1411 | 439/157 |
| 2006/0221559 A1* | 10/2006 | Campini | G06F 1/185 | 361/679.36 |
| 2006/0221711 A1* | 10/2006 | Ohta | G06K 7/0034 | 365/52 |
| 2008/0037218 A1* | 2/2008 | Sharma | H05K 7/1424 | 361/695 |
| 2008/0239649 A1* | 10/2008 | Bradicich | G06F 1/183 | 361/725 |
| 2008/0298014 A1* | 12/2008 | Franco | G06F 1/183 | 361/688 |
| 2009/0067146 A1* | 3/2009 | Huels | H05K 1/14 | 361/788 |
| 2009/0211083 A1* | 8/2009 | Bodenweber | G06F 1/185 | 29/737 |
| 2009/0271950 A1* | 11/2009 | Wang | E05B 1/0015 | 16/415 |
| 2011/0116755 A1* | 5/2011 | Rolston | G02B 6/4452 | 385/135 |
| 2014/0177144 A1 | 6/2014 | Wu | | |
| 2014/0187068 A1* | 7/2014 | Chia | H05K 7/1489 | 439/160 |
| 2015/0156912 A1* | 6/2015 | Liang | H05K 5/0221 | 361/726 |
| 2015/0163946 A1* | 6/2015 | Kyle | H05K 7/1421 | 312/295 |
| 2015/0245515 A1 | 8/2015 | Baek et al. | | |
| 2015/0351233 A1* | 12/2015 | Peterson | H05K 1/0278 | 361/785 |
| 2016/0077556 A1* | 3/2016 | Gong | G06F 1/181 | 361/679.32 |
| 2016/0150659 A1* | 5/2016 | Chen | H05K 7/1487 | 312/223.2 |
| 2016/0150667 A1* | 5/2016 | Xu | H05K 7/1489 | 361/679.4 |

\* cited by examiner

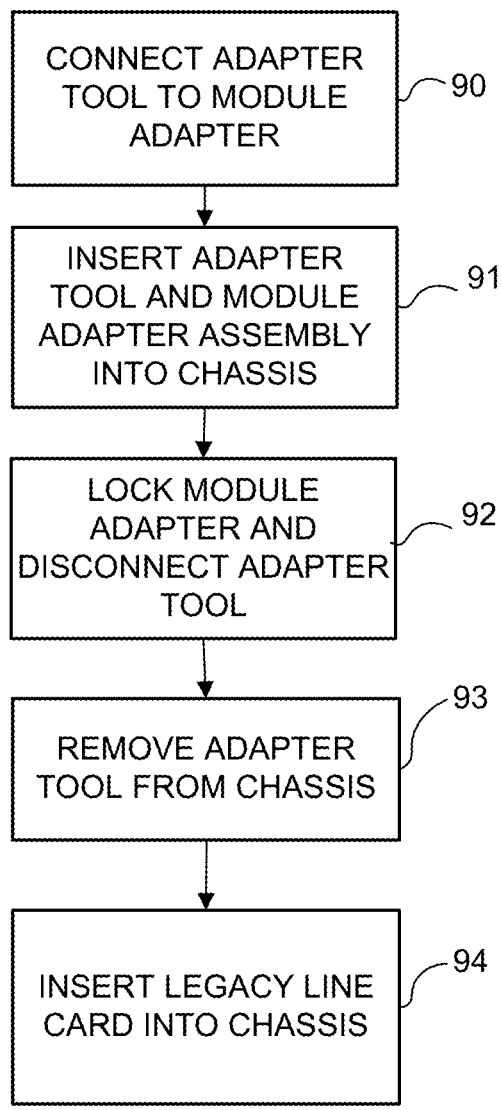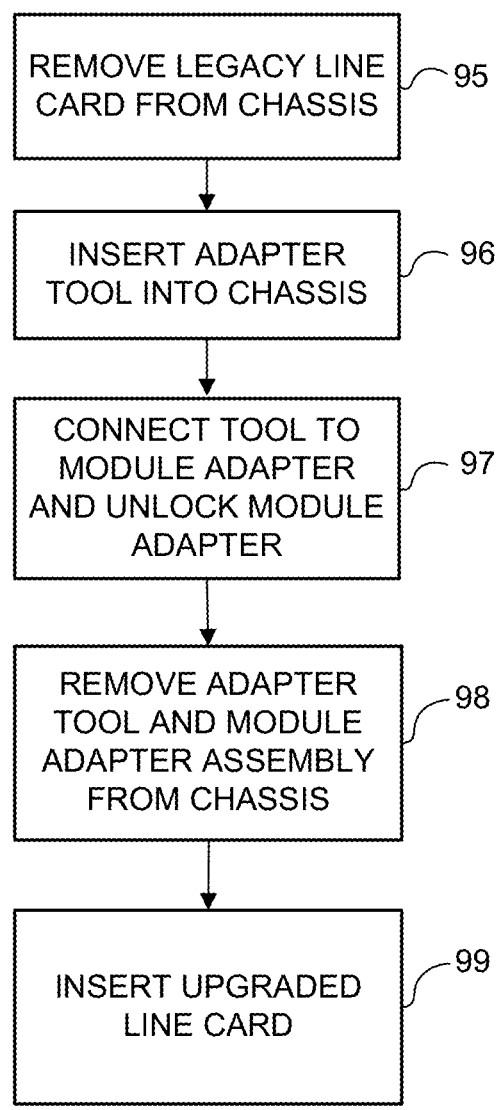
FIGURE 9A
FIGURE 9B

US 10,674,620 B2

REMOVABLE MODULE ADAPTER FOR MODULAR ELECTRONIC SYSTEM

TECHNICAL FIELD

The present disclosure relates generally to modular electronic systems, and more particularly, a module adapter for modular electronic systems.

BACKGROUND

Modular electronic systems are designed to provide flexibility to configure systems as per user needs and typically have multiple slots to accommodate a variety of modules (e.g., line cards, service cards, fabric cards, and the like). In conventional systems, line cards and other modules need to be modified or redesigned in order to be compatible with upgraded system designs.

BRIEF DESCRIPTION OF THE DRAWINGS

FIG. 9A is a flowchart illustrating an overview of a process for inserting the module adapter into a chassis for use with the legacy line card, in accordance with one embodiment.

FIG. 9B is a flowchart illustrating an overview of a process for removing the module adapter from the chassis, in accordance with one embodiment.

Corresponding reference characters indicate corresponding parts throughout the several views of the drawings.

DESCRIPTION OF EXAMPLE EMBODIMENTS

Overview

Figure 1:
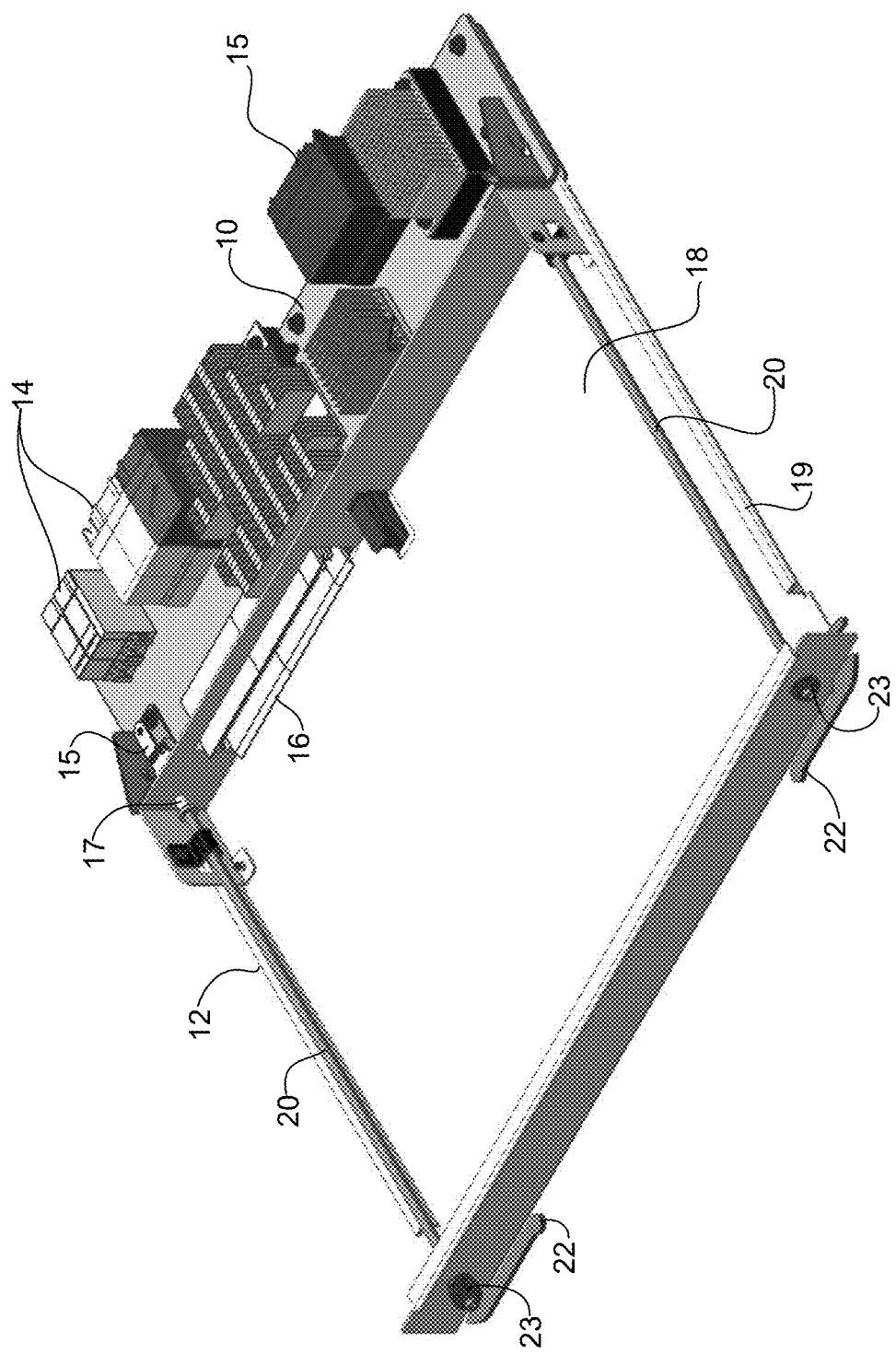
FIG. 1 is a perspective showing a module adapter and adapter tool, in accordance with one embodiment.

In one embodiment, an apparatus generally comprises a module adapter comprising a first connector for connection to a modular electronic system and a second connector for connection to a module inserted into a chassis of the modular electronic system to couple the module with the modular electronic system. The module adapter is removably inserted into the chassis of the modular electronic system with an adapter tool operable to lock the module adapter in place in the chassis.

In one or more embodiments, the first connector comprises a plurality of backplane connectors and the second connector comprises a line card connector. The module adapter may comprise latch brackets located on each side of the module adapter, the latch brackets configured for locking engagement with a chassis card guide. The latch bracket may be spring biased in a locked position and movable to an unlocked position upon engagement with a rotatable screw connected to the adapter tool. In one or more embodiments, the module adapter comprises a threaded insert for receiving a screw of the adapter tool for connection of the adapter tool to the module adapter. The module may comprise a legacy line card.

In another embodiment, an apparatus generally comprises a module adapter comprising a first connector for connection to a modular electronic system and a second connector for connection to a module inserted into a chassis of the modular electronic system to couple the module with the modular electronic system, and an adapter tool operable to insert and lock the module adapter in the chassis and unlock and remove the module adapter from the chassis. The adapter tool is removably connected to the module adapter.

In yet another embodiment, a method generally comprises connecting an adapter tool to a module adapter comprising a first connector for connection to a modular electronic system and a second connector for connection to a module to couple the module to the modular electronic system, inserting the adapter tool and the module adapter into a chassis of the modular electronic system, locking the module adapter in place in the chassis with the adapter tool, and removing the adapter tool from the chassis.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, servers, or other electronic devices may be configured as a modular electronic system with a plurality of removable modules (e.g., line cards, fabric cards, service cards, controller cards, or other cards, components, or FRUs (Field Replaceable Units)). Since network and computing system design development cycles are typically long, complex, and costly, it is important to ensure that the system is designed to accommodate future needs (e.g., power allocation, thermal output, bandwidth, and the like) and enable backward compatibility of legacy (older version, outdated, previous design) modules to provide maximum flexibility and enhance customer total cost of ownership. In conventional modular electronic systems (e.g., midplane/backplane designs) the mixing of legacy and newly designed modules (e.g., line cards) is limited due to the fixed and predetermined high speed interconnect on the midplane, which limits backward compatibility. One solution is to permanently attach a carrier card to an existing line card, however, this is a bulky and costly modification. Also, the carrier card is needed for each variation of input/output port and design, and is not an efficient use of resources.

The embodiments described herein allow legacy modules (e.g., line cards, fabric cards, or other FRUs) and new (upgraded, redesigned) modules to operate in the same system. As described in detail below, a module adapter (also referred to as a jacket card or adapter) may be installed into a slot of the chassis and remain installed in the chassis as long as it is needed. The module adapter is independent from the module so that the adapter can remain installed in the chassis for receiving a module having an interface that is not compatible with the system without the adapter installed. As described below with respect to FIG. 2, any number of module adapters may be inserted into the chassis to provide an easily configurable system that may use different versions of modules (e.g., legacy cards, upgraded cards, future designs of cards). This allows legacy card installation in a new system so that users may continue to use the legacy cards and upgrade to new cards over time rather than purchase all new cards at one time. When a new card is available for upgrade that is compatible with the new system, the module adapter may be easily removed. The system is thus designed to enable multiple upgrades overtime of field replaceable units.

In one or more embodiments, an adapter tool (also referred to as a carrier tray or insertion/extraction tool) is used to install the module adapter into the chassis slot and remove the module adapter from the chassis slot. As described in detail below, the module adapter may be attached to the adapter tool and inserted together as an assembly into the chassis. Once the module adapter is securely inserted and locked into place within the chassis using the adapter tool, the adapter tool is removed and the slot is ready to receive a legacy line card (or other FRU). Since the adapter tool is removed from the chassis after insertion of the module adapter, it may be used to insert or remove any number of module adapters, thus, only one adapter tool is needed. As previously noted, the module adapter is removably inserted into the chassis and can be removed at any time for insertion of an updated (compatible) module into the chassis.

The embodiments described herein operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. The network devices may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network). One or more of the network devices may comprise a modular electronic system comprising one or more module adapters described herein. The network device may include one or more processor, memory, and network interface. One or more of these components may be located on a module (line card or other FRU) removably inserted into the network device.

It is to be understood that the term "module" as used herein may refer to any modular electronic component, field replaceable unit, service card, line card, fabric card, or other card, component, or module configured for insertion and removal from the network device. The module may include, for example, one or more electronic components and circuits on a printed circuit board (PCB). The module may be coupled to data interfaces in the modular electronic system via the module adapter. For example, one or more of the modules may be coupled to a backplane of the modular electronic system for transmitting and receiving data. During insertion of the module into the chassis, connectors located on the module engage corresponding connectors on the module adapter for communication with backplane connectors through the module adapter. The module may allow the network device to interface and communicate with other network devices or networks. For example, the module may include a plurality of ports or other openings configured to receive connectors, cables, or pluggable transceiver modules (e.g., small form factor pluggable (SFP) transceiver modules, optical transceiver modules, etc.).

Referring now to the drawings, and first to FIG. 1, a module adapter 10 is shown attached to an adapter tool 12, in accordance with one embodiment. The module adapter 10 comprises one or more connectors (first connector) 14 (e.g., backplane connectors) located on a rear of the adapter for connection to corresponding connectors in the modular electronic system. The module adapter 10 further comprises one or more connectors (second connector) 16 (e.g., legacy line card connectors) located on a front of the adapter for connection to a module inserted into a chassis of the modular electronic system to couple (i.e., provide data connection between) the module and the modular electronic system. The adapter tool 12 is operable to insert and lock the module adapter 10 in the chassis and unlock and remove the module adapter from the chassis. The module adapter 10 and adapter tool 12 are connected, as shown in FIG. 1 and described below, and inserted together as an assembly into the chassis. The adapter tool 12 is removably connected to the module adapter 10 so that once the module adapter is inserted into the chassis the adapter tool can easily be removed to allow for insertion of a module (e.g., legacy line card) into the slot. Upon removal of the adapter tool 12, the module adapter 10 is locked in place in the chassis (e.g., securely engaged with chassis card guide) with latch mechanism 15 and the module adapter is ready for mating with the legacy line card. When a new module (e.g., upgraded line card) that is compatible with the modular electronic system is ready to be inserted into the chassis, the adapter tool 12 is inserted into the slot and connected to the module adapter 10 to unlock the module adapter and remove the adapter from the chassis. The slot is now ready for receiving the new module that is configured to interface directly with the modular electronic system without the module adapter 10.

In the example shown in FIG. 1, the adapter tool 12 comprises a tray 18 with side rails 19 for slidable engagement with card guides on side walls of the chassis. As described in detail below, screws 17 (e.g., lead screw, jack screw) extending through retaining rods 20 are used to connect and disconnect the adapter tool 12 and module adapter 10 and lock and unlock latching mechanism (latch bracket) 15 on the module adapter 10. The screws 17 are coupled to knobs 23 easily accessible from a front opening of the chassis for rotation of the screw in a first direction (to lock the module adapter 10 to the chassis and disconnect the adapter tool 12 from the module adapter) and a second direction (to connect the adapter tool to the module adapter and unlock the module adapter from the chassis) by hand or a tool. The knobs 23 may include, for example, ridges for finger tightening or loosening (rotation) of the screws 17. As shown in FIG. 1, the adapter tool 12 may include ejector arms 22 configured to provide leverage to engage and disengage the connectors 14 to the backplane.

It is to be understood that the module adapter 10 and adapter tool 12 shown in FIG. 1 is only an example and changes to the configuration or design of the module adapter or adapter tool may be made without departing from the scope of the embodiments.

Figure 2:
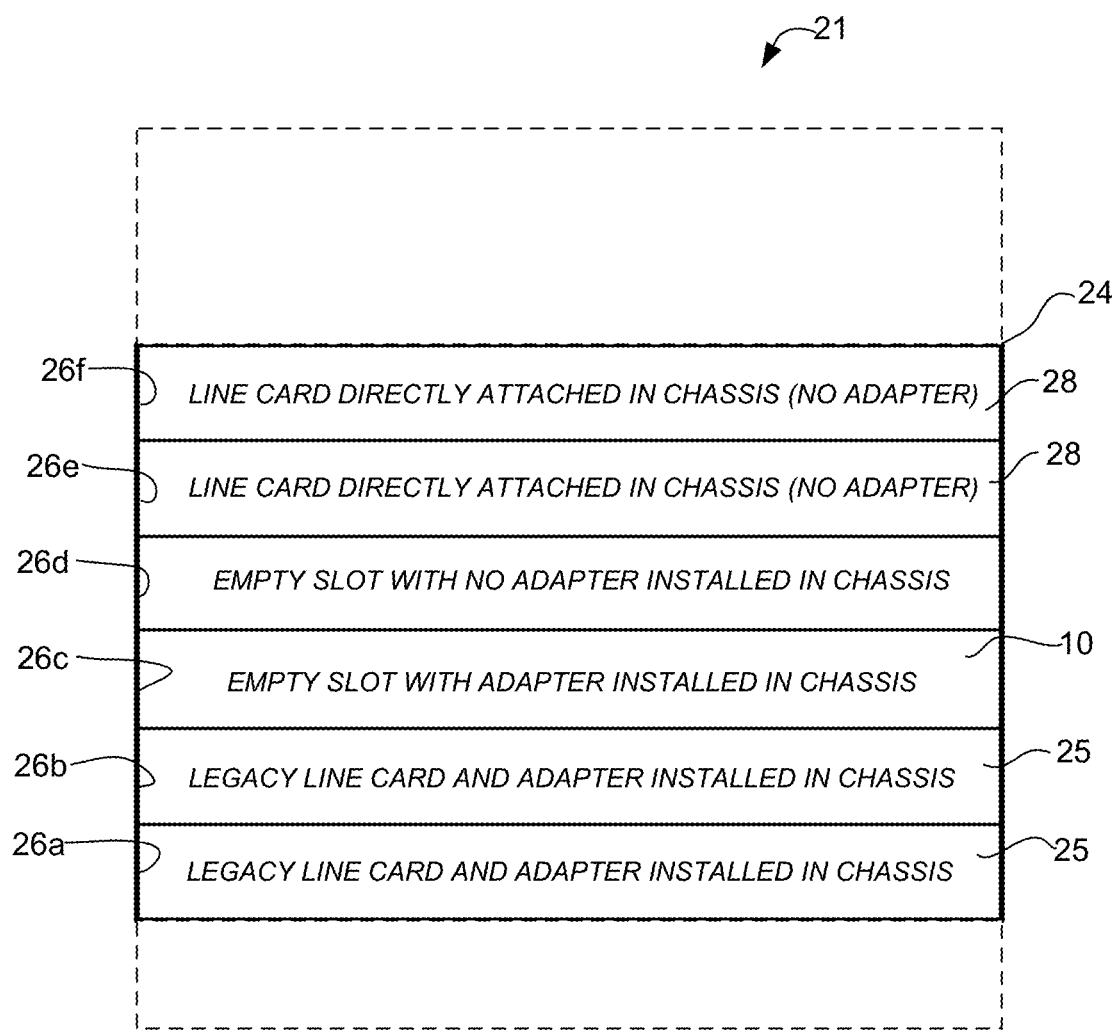
FIG. 2 is a schematic front view of a chassis showing slots of the chassis configured for receiving a line card or a legacy line card.

As previously noted, the module adapter 10 allows a modular electronic system to easily be modified to operate with any number of legacy or new modules. FIG. 2 is a schematic front view of a modular electronic system, generally indicated at 21, illustrating six slots 26a-26f of a chassis 24 for receiving modules (e.g., legacy line card 25 with module adapter 10 inserted into the slot or upgraded module 28). The chassis 24 may include one or more frames or structures configured to support components and slidably receive any number of removable modules (e.g., legacy line cards 25, upgraded (new) line cards 28). The chassis frame 24 may be formed from any suitable material including, for example, aluminum, steel, or any other metal, non-metal, or composite material.

In the example shown in FIG. 2, the bottom two slots 26a, 26b are filled with legacy line cards 25 coupled to the modular electronic system 21 with the module adapter 10 (located behind the legacy line card). The next slot 26c is empty (i.e., has no module installed) and the module adapter 10 is connected to the chassis at the rear of the slot and ready for connection to a legacy line card 25 when inserted into the slot. Slot 26d is empty (no module installed) and has no module adapter 10 inserted into the slot, and is therefore ready to receive a new (upgraded) module 28. The two top slots 26e, 26f have no module adapter 10 and contain new line cards 28 directly attached to the modular electronic system.

It is to be understood that the type, number, and arrangement of slots, modules, and module adapters shown in FIG. 2 is only an example and the chassis may include any number of slots (e.g., one or more) for receiving any number or type of modules (e.g., legacy, new) arranged in any format (e.g., positioned horizontally or vertically). Any number of the slots may have a module adapter 10 installed and the configuration of the modular electronic system (e.g., number of slots with module adapter) may be changed at any time. Other components or modules (e.g., power supply units, fan trays, filters) may be located above, below, or between the line card slots, or one or more modules may be inserted from a rear of the chassis.

Figure 3:
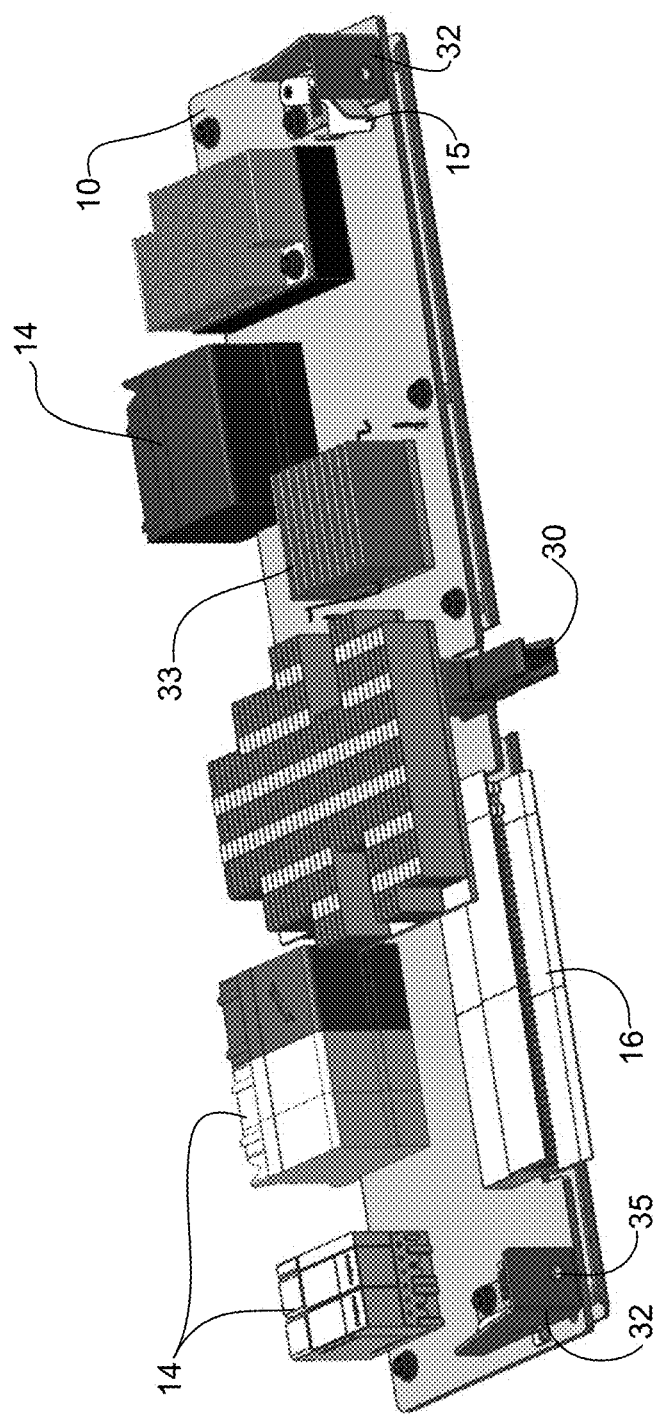
FIG. 3 is a perspective of the module adapter of FIG. 1.

FIG. 3 is a perspective of the module adapter 10 shown in FIG. 1, with the adapter tool removed. As previously described with respect to FIG. 1, the module adapter 10 comprises a plurality of backplane connectors (first connector) 14 and one or more line card connectors (second connector) 16. The module adapter 10 also includes a keying bracket 30. A latch assembly 32 is located at each edge of the module adapter 10 and includes the latch bracket 15 for securely attaching the module adapter to the chassis, as described in detail below with respect to FIG. 5. A front wall of the latch assembly includes an opening 35 for receiving the screw 17 of the adapter tool 12 (FIGS. 1 and 3). The module adapter 10 may also include one or more heatsinks 33.

Figure 4:
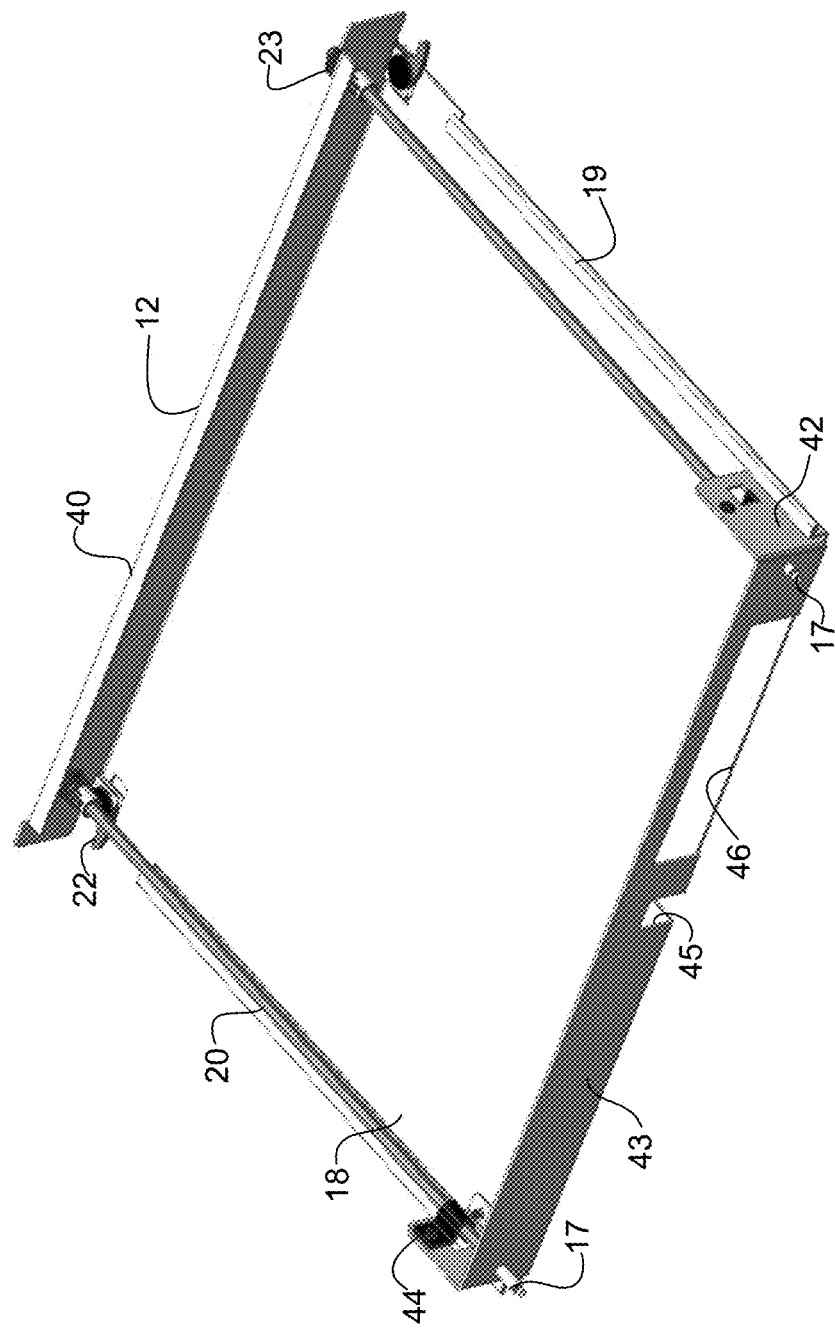
FIG. 4 is a perspective of the adapter tool of FIG. 1.

FIG. 4 is a perspective of the adapter tool 12 shown in FIG. 1, removed from the module adapter. In the example shown in FIG. 4, the adapter tool 12 comprises a tray 18 with integrally formed side rails 19 for slidable engagement with card guides on internal side walls of the chassis. The adapter tool 12 further comprises a face plate and the ejector arms 22 with handles extending outward from the face plate for removal of the adapter tool from the chassis (FIGS. 1 and 4). The face plate 40 includes openings for receiving the screws 17, which are coupled to the knobs 23 used to rotate the screws and connect/disconnect and lock/unlock the module adapter, as previously described. In the example shown in FIG. 4, the screws 17 extend through retaining rods 20 supported by guide brackets 42, for guiding the screw into mating openings on the module adapter. The guide brackets 42 may include one or more support members 44. As shown in FIG. 4, the screws 17 may be rotated to extend rearward from a rear wall 43 of the adapter tool 12 for engagement with the module adapter. The rear wall 43 includes openings at each side for pass through of the screws 17, opening 45 for receiving the keying bracket 30, and opening 46 for receiving the line card connector 16 of the module adapter 10 (FIGS. 3 and 4).

Figure 5:
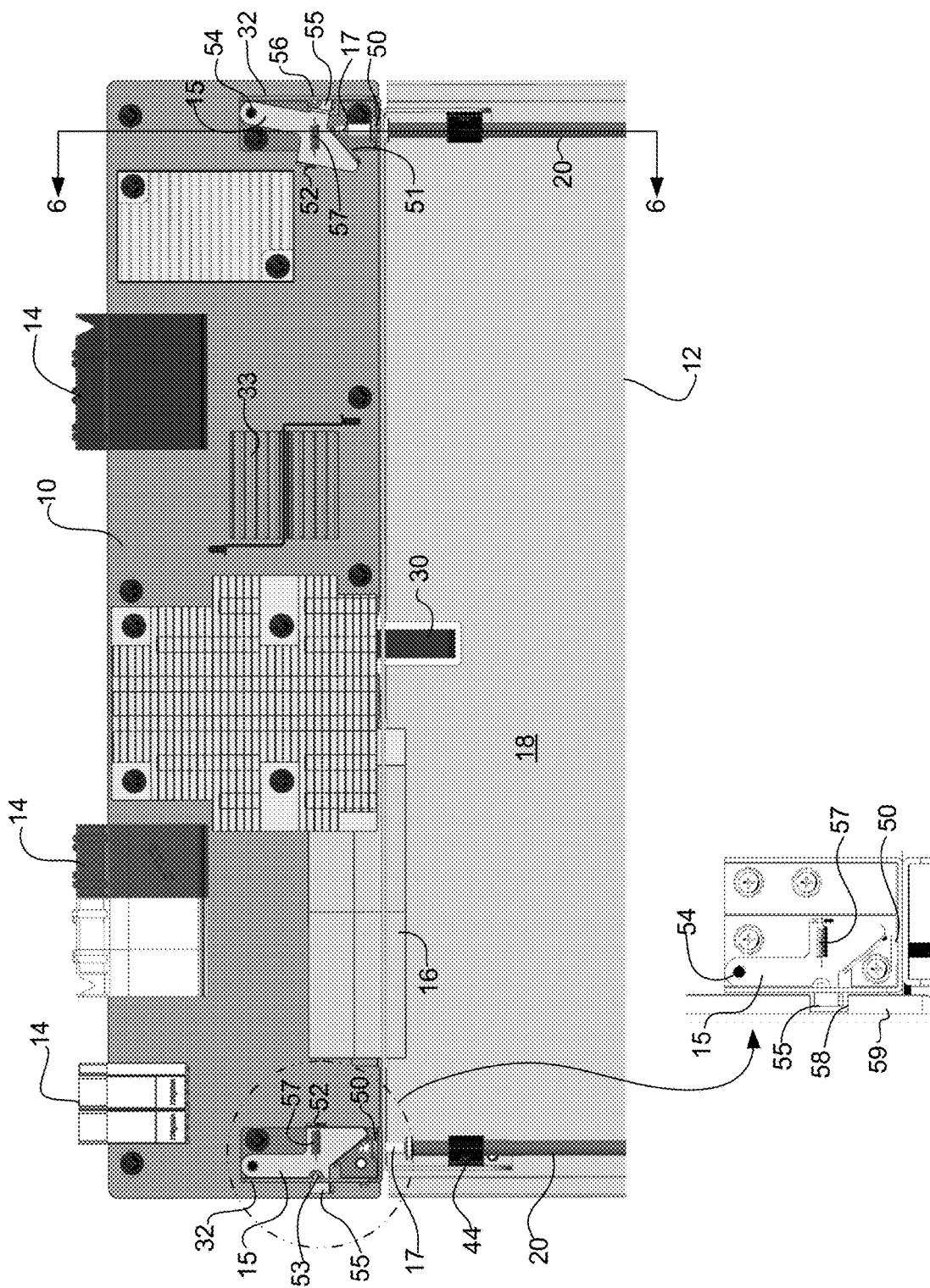
FIG. 5 is a partial top view of the adapter tool and module adapter of FIG. 1 with one latch bracket in a locked position and the other latch bracket in an unlocked position, and an enlarged view of the locked latch bracket engaged with a card guide cutout on the chassis.

FIG. 5 is a partial top view of the adapter tool 12 connected to the module adapter 10. In FIG. 5, both of the screws 17 are rotated so that they are inserted into the module adapter 10 at opening 35 (FIG. 3) formed in a front wall of the latch assembly 32 adjacent to threaded insert 50. The adapter tool 12 is connected to the module adapter 10 with the screws 17 inserted into the threaded inserts 50. The screw 17 on the right (as viewed in FIG. 5) is engaged with the latch bracket 15 at cam surface 51, which forces the bracket to pivot about pivot point 54 and move latch member 55 away from opening 56 in a sidewall of the latch assembly 32. The screw 17 on the left is disengaged from the latch bracket 15 and the bracket is free to rotate back to its original spring biased position. Spring 57 is attached at one end to the latch bracket at connection member 52 and at the other end to the sidewall of the latch assembly 32 at attachment point 53 and maintains the latch bracket 15 in its locked position when the screw 17 is moved away from the bracket and the adapter tool 12 is removed from the chassis. In this locked position, latch member 55 extends into a cutout 58 in a chassis card guide 59, as shown in the enlarged view of the locked latch bracket.

Figure 6:
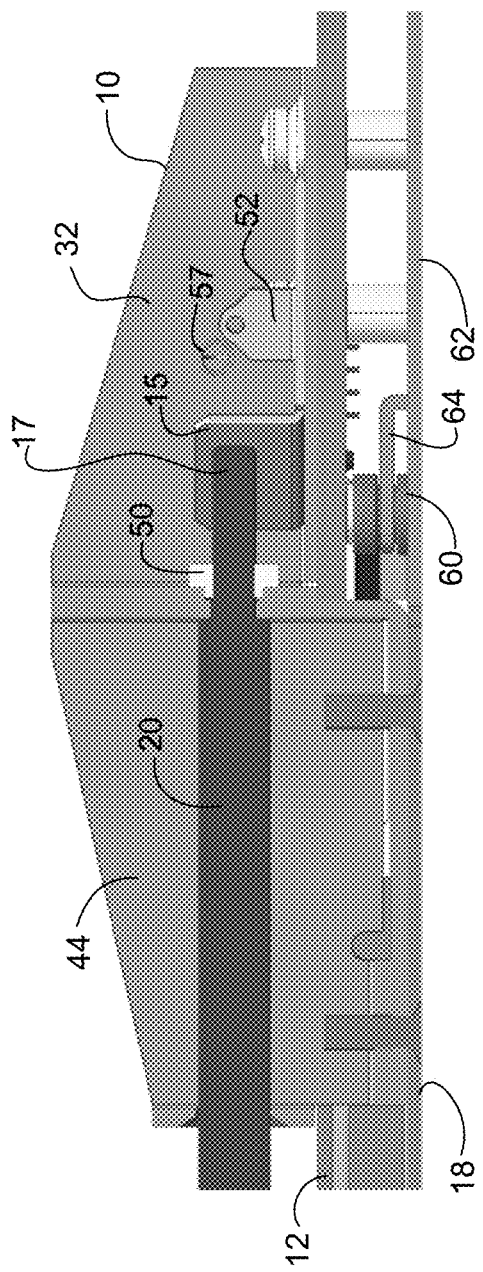
FIG. 6 is a cross-sectional view taken through line 6-6 of FIG. 5.

FIG. 6 is a cross-sectional view taken through line 6-6 of FIG. 5. The screw 17 extends through the guide bracket 44 on the adapter tool 12 and the threaded insert 50 on the module adapter 10, and contacts the latch bracket 15 at cam surface 51, as previously described. In this example, a keyed standoff 60 extends from the adapter tool 12 and engages a member 64 extending upward from a tray 62 of the module adapter 10 for proper alignment of the adapter tool 12 and module adapter 10.

Figure 7A:
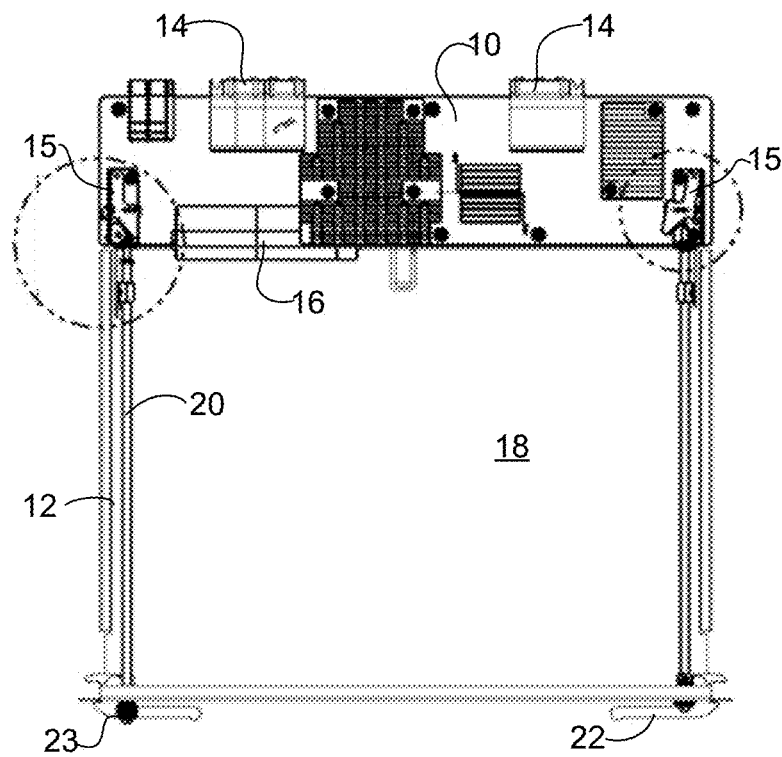
FIG. 7A is a top view of the module adapter and adapter tool of FIG. 1.
Figure 7B:
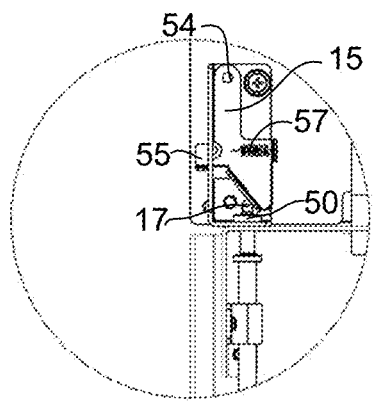
FIG. 7B is an enlarged cutout view showing details of the locked latch bracket of FIG. 7A.
Figure 7C:
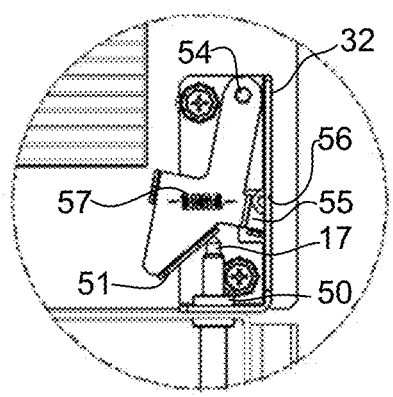
FIG. 7C is an enlarged cutout view showing details of the unlocked latch bracket of FIG. 7A.

FIG. 7A is another top view of the module adapter 10 connected to the adapter tool 12. Enlarged views of the locked and unlocked latch bracket are shown in FIGS. 7B and 7C, respectively. The screw 17 on the left (FIG. 7B) is backed off from the latch bracket 15 and the bracket is free to rotate back to its spring loaded position. The screw 17 on the right (FIG. 7C) is engaged with the latch bracket 15 at cam surface 51, which forces the bracket to pivot about pivot point 54 and move latch member 55 away from opening 56 in the sidewall of the latch assembly 32.

Figure 8A:
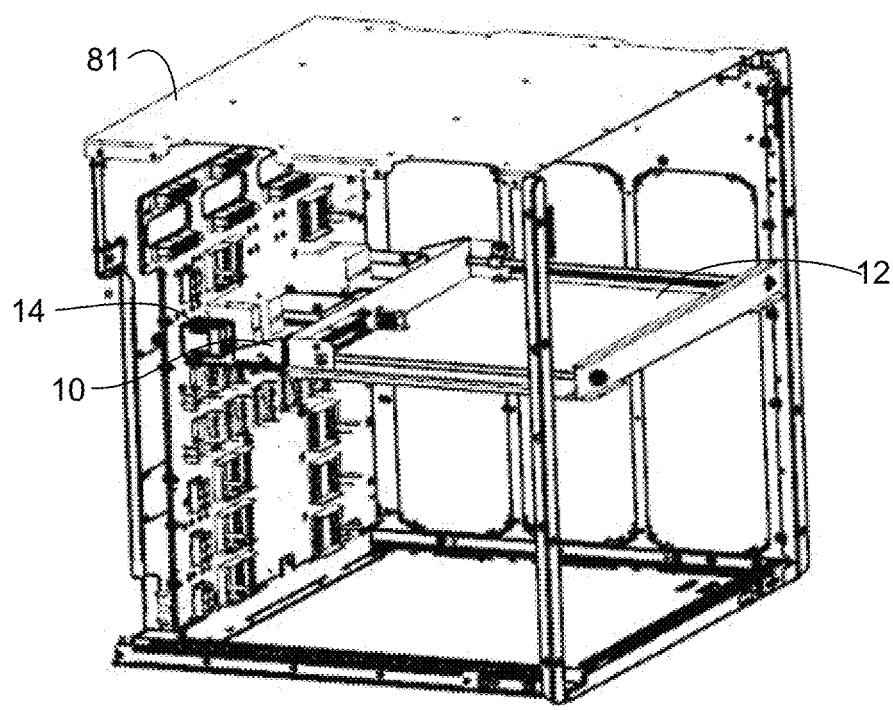
FIG. 8A is a perspective of the module adapter and adapter tool installed in a chassis, with a wall of the chassis removed to show detail.
Figure 8B:
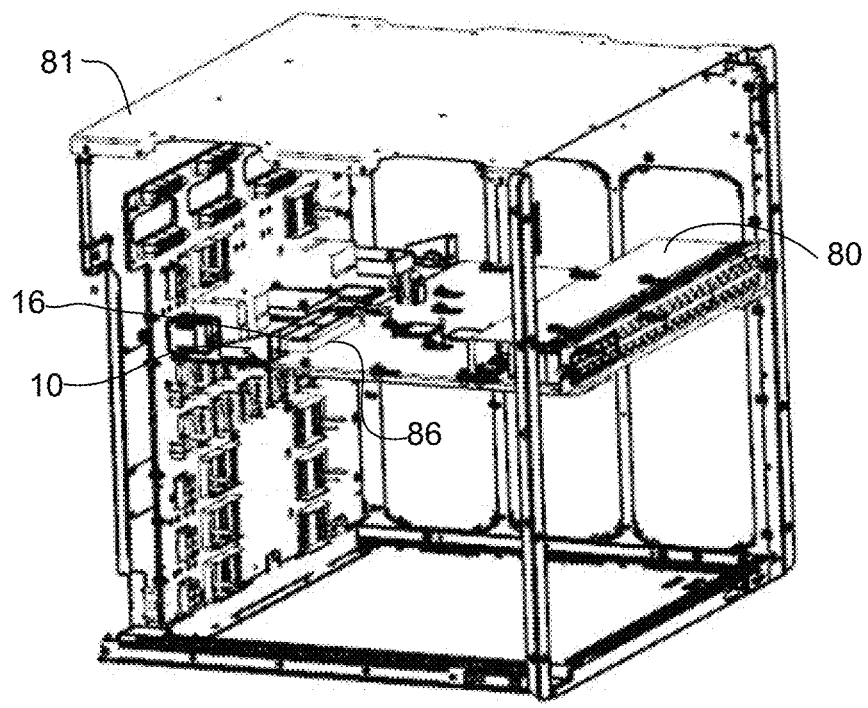
FIG. 8B is a perspective of the module adapter and a line card installed in the chassis, with a wall of the chassis removed to show detail.

FIG. 8A is a perspective of the module adapter 10 and adapter tool 12 installed in a chassis 81, with a wall of the chassis removed to show detail. As previously described, the backplane connectors 14 connect to the modular electronic system at a rear wall of the chassis. FIG. 8B shows the chassis 81 of FIG. 8A with the adapter tool 12 removed and a legacy line card 80 inserted and connected to the module adapter 10. A line card connector 86 is connected to the line card connector 16 on the module adapter, as previously described. The line card 80 may include any number of electronic components (e.g., chips, processors, ASICs), ports, circuits, or other components.

It is to be understood that the line card 80 shown in FIG. 8 is only an example and that other types of modules may be inserted into the chassis and connected to the adapter, without departing from the scope of the embodiments.

FIG. 9A is a flowchart illustrating an overview of a process for inserting the module adapter 10 into a chassis, in accordance with one embodiment. At step 90, the adapter tool 12 is connected to the module adapter 10 (FIGS. 1 and 9A). The adapter tool and module adapter assembly is then inserted into the chassis (step 91). The adapter tool 12 locks the module adapter in place in the chassis and is disconnected from the module adapter 10 (step 92). The adapter tool is then removed from the chassis (step 93). As previously described with respect to FIG. 5, the screw 17 may be rotated to disengage with the latch bracket 15 and be removed from threaded insert 50 on the module adapter, thereby locking the module adapter in place in the chassis and disconnecting the adapter tool 12 from the module adapter 10. A legacy line card (or other module compatible with the module adapter) may then be inserted into the chassis (step 94).

FIG. 9B is a flowchart illustrating an overview of a process for removing the module adapter 10 from the chassis. At step 95, the legacy line card is removed from the chassis. The adapter tool 12 is then inserted into the chassis (step 96). The adapter tool 12 is connected to the module adapter 10 and unlocks the module adapter from the chassis (step 97). As previously described with respect to FIG. 5, once the adapter tool 12 is inserted into the chassis, the screws 17 may be rotated to enter through the threaded insert 50 and engage latch bracket 15 thereby connecting the adapter tool to the module adapter 10 and unlocking the module adapter from the chassis. The module adapter and adapter tool assembly may then be removed from the chassis (step 98). An upgraded (new) line card (compatible with the modular electronic system) may then be inserted into the empty slot (step 99).

It is to be understood that the processes shown in FIGS. 9A and 9B are only examples and steps may added, combined, modified, or removed, without departing from the scope of the embodiments.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a module adapter comprising a first connector for connection to a modular electronic system and a second connector for connection to a module inserted into a chassis of the modular electronic system to couple the module with the modular electronic system;
   wherein the module adapter is removably inserted into the chassis of the modular electronic system with an adapter tool operable to lock the module adapter in place in the chassis and removable from the chassis with the module adapter locked in place in the chassis.

2. The apparatus of claim 1 wherein the first connector comprises a plurality of backplane connectors and the second connector comprises a line card connector.

3. The apparatus of claim 1 wherein the module adapter comprises latch brackets located on each side of the module adapter, the latch brackets configured for locking engagement with a chassis card guide.

4. The apparatus of claim 3 wherein the latch bracket is spring biased in a locked position and movable to an unlocked position upon engagement with a rotatable screw connected to the adapter tool.

5. The apparatus of claim 1 wherein the module adapter comprises a threaded insert for receiving a screw of the adapter tool for connection of the adapter tool to the module adapter.

6. The apparatus of claim 1 wherein the module comprises a legacy line card.

7. An apparatus comprising:
   a module adapter comprising a first connector for connection to a modular electronic system and a second connector for connection to a module inserted into a chassis of the modular electronic system to couple the module with the modular electronic system; and
   an adapter tool operable to insert and lock the module adapter in the chassis and unlock and remove the module adapter from the chassis;
   wherein the adapter tool is removably connected to the module adapter.

8. The apparatus of claim 7 wherein the first connector comprises a plurality of backplane connectors and the second connector comprises a line card connector.

9. The apparatus of claim 7 wherein the module adapter comprises latch brackets located on each side of the module adapter, the latch brackets configured for locking engagement with a chassis card guide.

10. The apparatus of claim 9 wherein the latch bracket is spring biased in a locked position and movable to an unlocked position upon engagement with a rotatable screw connected to the adapter tool.

11. The apparatus of claim 7 wherein the module adapter comprises a threaded insert for receiving a screw of the adapter tool for connection of the adapter tool to the module adapter.

12. The apparatus of claim 7 wherein the adapter tool comprises a screw and wherein rotation of the screw in one direction connects the adapter tool to the module adapter and unlocks the module adapter from the chassis and rotation of the screw in an opposite direction locks the module adapter to the chassis and disconnects the adapter tool from the module adapter.

13. The apparatus of claim 7 wherein the module comprises a legacy line card.

14. The apparatus of claim 7 wherein the adapter tool comprises a tray configured for slidable engagement with the chassis.

15. A method comprising:
   connecting an adapter tool to a module adapter comprising a first connector for connection to a modular electronic system and a second connector for connection to a module to couple the module to the modular electronic system;
   inserting the adapter tool and the module adapter into a chassis of the modular electronic system;
   locking the module adapter in place in the chassis with the adapter tool; and
   removing the adapter tool from the chassis with the module adapter locked in place in the chassis.

16. The method of claim 15 further comprising removing the module adapter from the chassis and inserting an upgraded module into the chassis.

17. The method of claim 15 further comprising removing the module adapter from the chassis, wherein removing the module adapter from the chassis comprises:
- inserting the adapter tool into the chassis;
- connecting the adapter tool to the module adapter;
- unlocking the module adapter from the chassis; and
- removing the adapter tool and the module adapter from the chassis.

18. The method of claim 15 wherein the first connector comprises a plurality of backplane connectors and the second connector comprises a line card connector.

19. The method of claim 15 wherein locking the module adapter in place in the chassis comprises rotating a screw connected to the adapter tool to release a spring loaded bracket for engagement of the bracket with a chassis card guide.

20. The method of claim 15 further comprising inserting the module comprising a legacy line card into the chassis, wherein the chassis comprises a plurality of slots, at least one of the slots comprising a line card connected directly to the modular electronic system without the module adapter.

* * * * *